(12) United States Patent
Verbruggen et al.

(10) Patent No.: US 10,291,247 B1
(45) Date of Patent: May 14, 2019

(54) CHOPPING SWITCH TIME-SKEW CALIBRATION IN TIME-INTERLEAVED ANALOG-TO-DIGITAL CONVERTERS

(71) Applicant: Xilinx, Inc., San Jose, CA (US)

(72) Inventors: Bob W. Verbruggen, Saggart (IE); Christophe Erdmann, Dublin (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/914,364

(22) Filed: Mar. 7, 2018

(51) Int. Cl.
*H03M 1/06* (2006.01)
*H03M 1/10* (2006.01)
*H03M 1/12* (2006.01)

(52) U.S. Cl.
CPC ....... *H03M 1/1023* (2013.01); *H03M 1/1215* (2013.01); *H03M 1/1028* (2013.01)

(58) Field of Classification Search
CPC .... H03M 1/1215; H03M 1/1028; H03M 1/12; H03M 1/0624; H03M 1/121; H03M 1/0836; H03M 1/1019; H03M 1/128; H03M 1/1009; H03M 1/1061; H03M 1/1225
USPC ................................. 341/118, 120, 141, 142
See application file for complete search history.

(56) References Cited

U.S. PATENT DOCUMENTS

| | | | |
|---|---|---|---|
| 7,250,885 B1 * | 7/2007 | Nairn | H03M 1/1215 341/141 |
| 7,295,639 B1 | 11/2007 | Cory | |
| 7,312,631 B1 | 12/2007 | Bauer et al. | |
| 7,372,386 B1 * | 5/2008 | Maloberti | H03M 1/0626 341/137 |
| 7,376,199 B1 | 5/2008 | Nix | |
| 7,475,297 B1 | 1/2009 | Manaker, Jr. | |
| 7,548,089 B1 | 6/2009 | Bauer et al. | |
| 8,411,703 B1 | 4/2013 | Cory | |
| 8,830,094 B1 | 9/2014 | Erdmann | |
| 8,917,125 B1 * | 12/2014 | Waltari | H03M 1/124 327/147 |
| RE45,343 E * | 1/2015 | Kidambi | H03M 1/0624 341/118 |
| 9,106,249 B1 * | 8/2015 | Dyer | H03M 1/1004 |
| 9,167,058 B2 | 10/2015 | Gresham et al. | |
| 9,444,480 B1 * | 9/2016 | Zanchi | H03M 1/1009 |
| 9,584,145 B1 * | 2/2017 | Shin | H03M 1/1028 |
| 2006/0176197 A1 * | 8/2006 | McNeill | H03M 1/1004 341/120 |
| 2010/0026536 A1 * | 2/2010 | Yoshioka | G11C 27/02 341/122 |
| 2013/0027233 A1 * | 1/2013 | Nozaki | H03M 1/12 341/118 |
| 2013/0058437 A1 * | 3/2013 | Oshima | H03M 1/0836 375/316 |

(Continued)

*Primary Examiner* — Linh V Nguyen
(74) *Attorney, Agent, or Firm* — Robert M. Brush

(57) ABSTRACT

An example time-skew calibration circuit includes a plurality of first circuits, each including a first accumulator and a second accumulator. The time-skew calibration circuit further includes a plurality of second circuits, each including a first adder coupled to outputs of the first accumulator and the second accumulator, and a first subtractor coupled to the outputs of the first accumulator and the second accumulator. The time-skew calibration circuit further includes a decision circuit configured to combine an output of the first adder and an output of the first subtractor.

16 Claims, 9 Drawing Sheets

(56) References Cited

U.S. PATENT DOCUMENTS

2013/0241755 A1* 9/2013 Chen .................. H03M 1/1009
341/120

* cited by examiner

CHOPPING SWITCH TIME-SKEW CALIBRATION IN TIME-INTERLEAVED ANALOG-TO-DIGITAL CONVERTERS

This invention was made, in part, with Government support under Agreement No. HR0011-16-3-0004, awarded by Defense Advanced Research Projects Agency. The Government has certain rights in the invention.

TECHNICAL FIELD

Examples of the present disclosure generally relate to electronic circuits and, in particular, to chopping switch time-skew calibration in time-interleaved analog-to-digital converters (ADCs).

BACKGROUND

Time-interleaving is used almost universally in radio frequency (RF) sampling analog-to-digital converters (ADCs). Time-interleaved ADCs instantiate several ADC channels in parallel with sampling points spread evenly across the channels. The main advantage is that the overall ADC sampling rate is N times higher than using a single channel (where N is the number of channels).

The limitation of time-interleaving is that in the presence of unavoidable mismatch, the output spectrum is corrupted. The offset, gain, and timing mismatch errors can be calibrated to reduce them to acceptable levels. However, flicker noise in the ADC channels is up-converted and appears around the offset spurs. This flicker noise cannot be calibrated and is an increasing problem in deeply-scaled complementary metal oxide semiconductor (CMOS) devices.

Chopping is a technique to frequency-translate circuit non-idealities with the goal of minimizing their impact on circuit performance. When applied to a time-interleaved ADC, chopping can spread out offset errors or flicker noise across frequency, preventing serious corruption of the spectrum near the ADC offset frequencies. This chopping can be added to any ADC architecture by adding a second set of sampling switches that sample the signal with opposite polarity to the original set of sampling switches. By selectively acquiring the input signal using one or the other set of switches and inverting the output signal when appropriate, the chopping operation is achieved. When chopping is not required, the additional switches can simply be disabled and do not adversely affect performance in any way. However, one drawback of this technique is that the newly added switches are subject to sampling time mismatch, which can lead to serious degradation of the converter noise floor.

SUMMARY

Techniques for chopping switch time-skew calibration in time-interleaved analog-to-digital converters (ADCs) are described. In an example, a time-skew calibration circuit includes: a plurality of first circuits, each including a first accumulator and a second accumulator; a plurality of second circuits, each including: a first adder coupled to outputs of the first accumulator and the second accumulator; a second adder coupled to the outputs of the first accumulator and the second accumulator; a third adder coupled to an output of the first adder; a first multiplier coupled to an output of the third adder; a second multiplier coupled to an output of the second adder; a third accumulator coupled to outputs of the first and second multipliers; and a fourth accumulator coupled to the outputs of the first and second multipliers; and an average circuit coupled to the outputs of the first and second accumulators and to an input of the third adder.

In another example, an analog-to-digital converter (ADC) includes: a plurality of channels each including a chopping circuit; and a time-skew calibration circuit coupled to the plurality of channels, comprising: a plurality of first circuits, each including a first accumulator and a second accumulator; a plurality of second circuits, each including: a first adder coupled to outputs of the first accumulator and the second accumulator; a second adder coupled to the outputs of the first accumulator and the second accumulator; a third adder coupled to an output of the first adder; a first multiplier coupled to an output of the third adder; a second multiplier coupled to an output of the second adder; a third accumulator coupled to outputs of the first and second multipliers; and a fourth accumulator coupled to the outputs of the first and second multipliers; and an average circuit coupled to the outputs of the first and second accumulators and to an input of the third adder.

In another example, a method of time-skew calibration for a time-interleaved analog-to-digital converter (ADC) includes: synchronizing a chopping sequence applied to chopping circuits in channels of the ADC to a time-skew calibration observation window; inverting polarity of the chopping sequence half-way into the time-skew calibration observation window; and executing a dual-loop time-skew calibration on outputs of the channels of the ADC.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
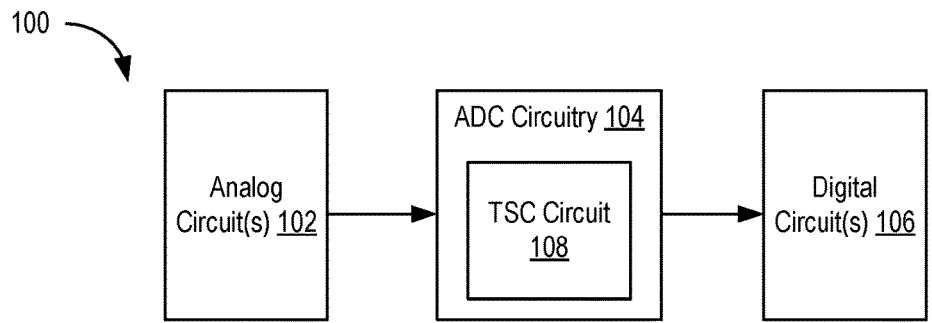
FIG. 1 is a block diagram depicting an analog-to-digital system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

As explained above, many time-interleaved analog-to-digital converters (ADCs) include some form of time-skew calibration circuit that senses and corrects for time-skew errors in the background. Various known algorithms exist, but such algorithms cannot easily be extended to calibrate time-skews of chopping switches. Consider a four-channel time-interleaved ADC. Each channel in such an ADC samples the input signal in turn. In such an ADC, the sequence of sampling events is fixed: channel 1 always follows channel 0; channel 2 always follows channel 1, etc. Each sampling switch is used at a fixed interval (four times the clock period). For each channel, a time-skew calibration algorithm determines the absolute value of the difference between current channel output and the previous channel output and accumulates this absolute value in an accumulator. The average of these accumulators across all channels is subtracted from each individual accumulator output and the resulting differences are in turn added to a second accumulator having a specific gain. The output of the second accumulators are a measure for the time-skew between channels, and can be applied to a correction circuit (e.g., a digital-to-time converter (DTC) that delays a sampling edge) after rounding. This algorithm leverages the fact that, for signals in the first (or any other odd) Nyquist zone, the absolute value of the difference between consecutive samples is proportional to the time between these sampling points. For signals in the second (or any other even) Nyquist zone, the sign of the feedback simply needs to be inverted.

Consider now a four-channel time-interleaved ADC with chopping sampling switches. Each channel still samples the signal in turn, but for each channel there is now a (pseudo-) random choice between two different sampling switches with slightly different sampling times. The addition of chopping sampling switches has two important consequences for the calibration algorithm: 1) the number of sampling times to be calibrated doubles from four to eight in a four-channel time-interleaved ADC; and 2) the sampling positions of each set of switches no longer occurs at regular intervals. Depending on the random number generator, one sampling polarity may not be used for an extended amount of time in favor of the other sampling polarity. This can introduce interaction between the input signal and the chopping sequence, adding significant noise to the calibration algorithm that needs to be handled. Example techniques described herein allow for reliable background calibration in the presence of any input signal.

FIG. 1 is a block diagram depicting an analog-to-digital system 100 according to an example. The system 100 includes one or more analog circuits 102, analog-to-digital converter (ADC) circuitry 104, and one or more digital circuits 106. The analog circuit(s) 102 generate one or more analog signals as output (e.g., continuous time, continuous amplitude signals). The ADC circuitry 104 processes the analog signal(s) and generates one or more digital signals as output (e.g., discrete time, discrete amplitude signals). The digital circuit(s) 106 receive the digital signal(s) for further processing. For example, the analog circuit(s) 102 can be sensors disposed on an integrated circuit (IC), such as temperature sensors, voltage sensors, current sensors, or the like. The ADC circuitry 104 and digital circuit(s) 106 can be part of a monitor circuit or the like configured to monitor the analog signals output by the sensors and perform various actions. It should be understood that there are a myriad of other applications for the ADC circuitry 104. In an example, the ADC circuitry 104 comprises a time-interleaved ADC that includes time-skew calibration (TSC) circuit 108. The TSC circuit 108 is configured to sense and correct time-skew errors in the background, as describe further below.

Figure 2:
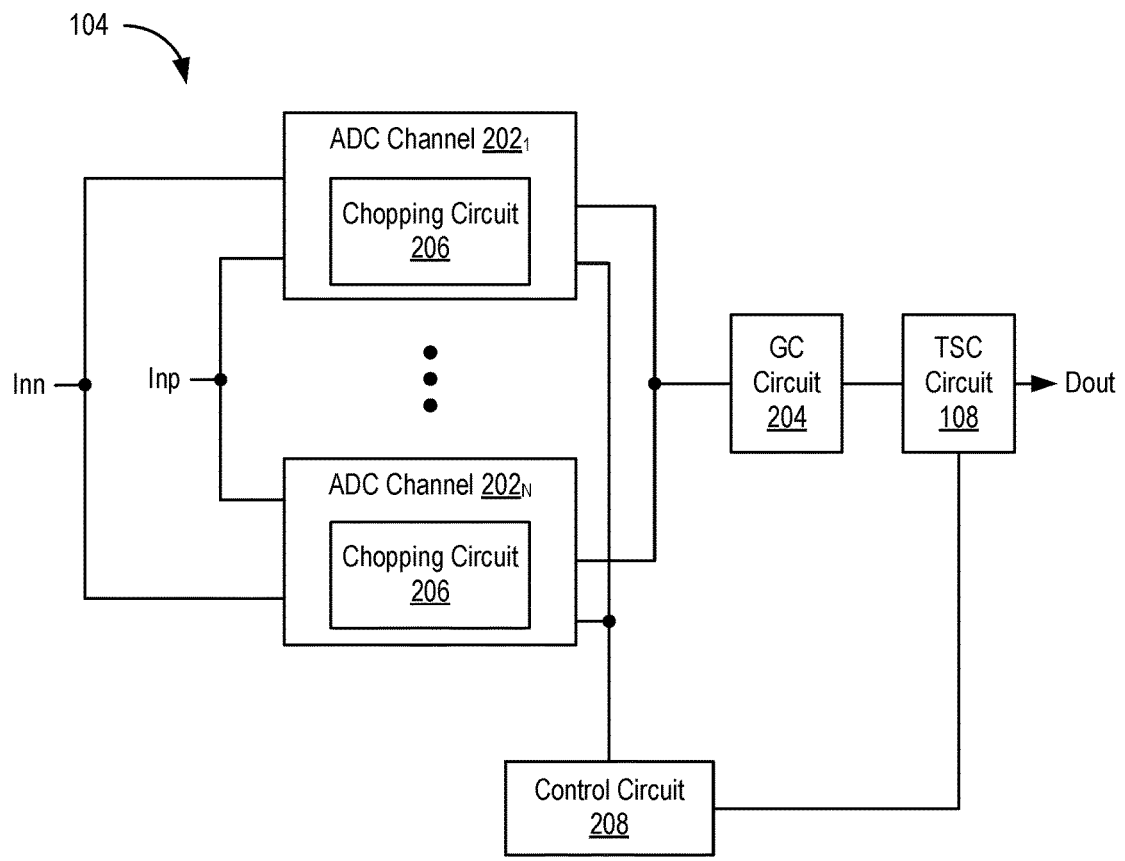
FIG. 2 is a block diagram depicting ADC circuitry according to an example.

FIG. 2 is a block diagram depicting the ADC circuitry 104 according to an example. In the example, the ADC circuitry 104 receives a differential analog signal as input. The differential analog signal includes a positive component Inp and a negative component Inn. The ADC circuitry 104 includes a plurality of ADC channels, e.g., ADC channels $202_1 \ldots 202_N$, where N is an integer greater than one. The ADC circuitry 104 further includes a gain calibration (GC) circuit 204 and the TSC circuit 108. Inputs of each ADC channel $202_1 \ldots 202_N$ receive the positive and negative components of the differential analog input signal. Digital outputs of the ADC channels $202_1 \ldots 202_N$ are coupled to an input of the GC circuit 204. An output of the GC circuit 204 is coupled to an input of the TSC circuit 108. An output of the TSC circuit 108 provides a digital output signal of the ADC circuitry 104. The ADC channels $202_1 \ldots 202_N$ include chopping circuits 206 configured to alternate the polarity of the analog input signal in a pseudo-random manner, as described further below. The ADC circuitry 104 further includes a control circuit 208. An output of the control circuit 208 is coupled to control inputs of each of the ADC channels $202_1 \ldots 202_N$ and the TSC circuit 108.

In operation, the ADC channels $202_1 \ldots 202_N$ each sample the differential analog input signal. The ADC channels $202_1 \ldots 202_N$ receive clock signals from the control circuit 208 and sample the differential analog signal in time-interleaved fashion. For example, each ADC channel 202 can sample the differential analog signal at a different phase of a given clock signal. The GC circuit 204 is configured to compare the root mean squared (RMS) power of each ADC channel 202 and adjust the outputs with respect to a reference. The TSC circuit 108 operates as described further below.

Figure 3:
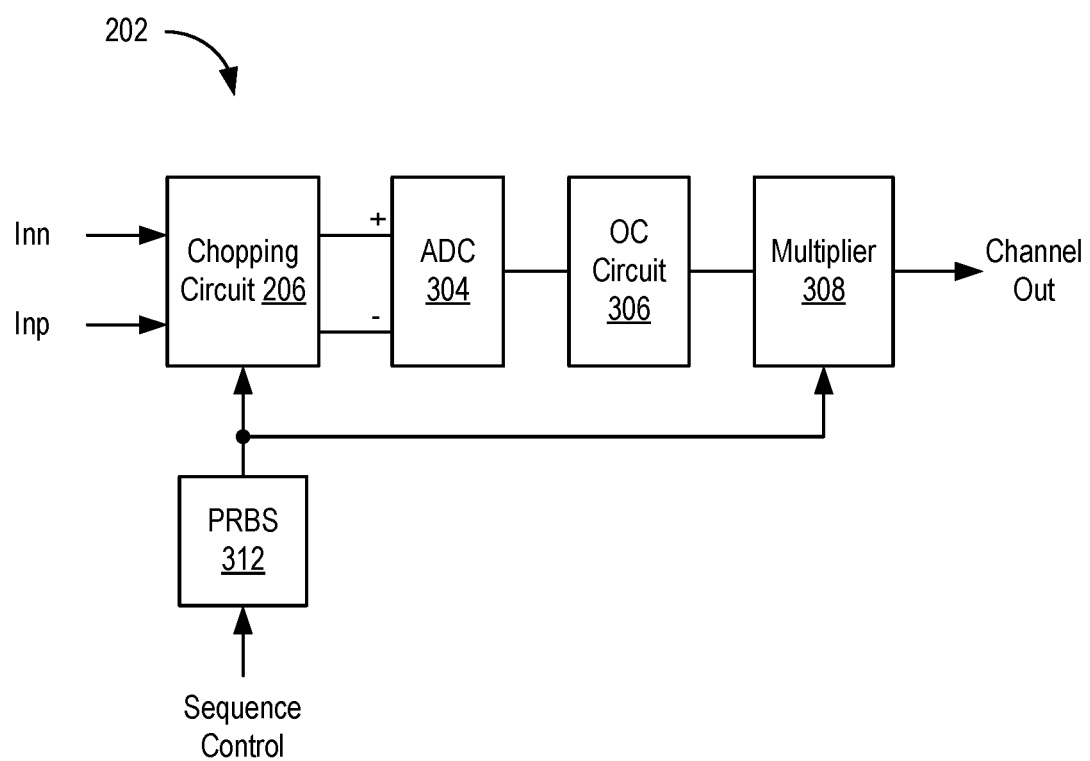
FIG. 3 is a block diagram depicting an ADC channel according to an example.

FIG. 3 is a block diagram depicting an ADC channel 202 according to an example. The ADC channel 202 includes a chopping circuit 206, an ADC 304, an OC circuit 306, a multiplier 308, and a pseudorandom binary sequence (PRBS) circuit 312. Inputs of the chopping circuit 206 receive the differential analog signal as input. A differential output of the chopping circuit 206 is coupled to a differential input of the ADC 304. An output of the ADC 304 is coupled to an input of the OC circuit 306. An output of the OC circuit 306 is coupled to an input of the multiplier 308, which provides the output of the ADC channel 202. An output of the PRBS circuit 312 is coupled to an input of the chopping circuit 206 and an input of the multiplier 308.

In operation, the chopping circuit 206 samples the differential analog input signal. The chopping circuit 206 alternates coupling Inn and Inp to the non-inverting (+) and inverting (−) terminals of the ADC 304 based on a signal output by the PRBS circuit 312. In this manner, the digital signal output by the ADC 304 is randomized. Also, the chopping circuit 206 prevents the analog input signal at the sampling frequency of the ADC channel 202 from being seen as DC. The OC circuit 306 removes the offset of the ADC 304. The multiplier 308 "un-chops" the output of the OC circuit 306 using the same PRBS signal output from the PRBS circuit 312. In addition to enabling the presence of signals at the sampling frequency, this configuration also has the capability of reducing the effect of flicker noise. If the frequency response of the OC circuit 306 is low enough, the OC circuit 306 is unable to follow the flicker noise, which ends up getting scrambled across the spectrum instead of appearing at multiples of the channel sampling frequency.

Figure 5A:
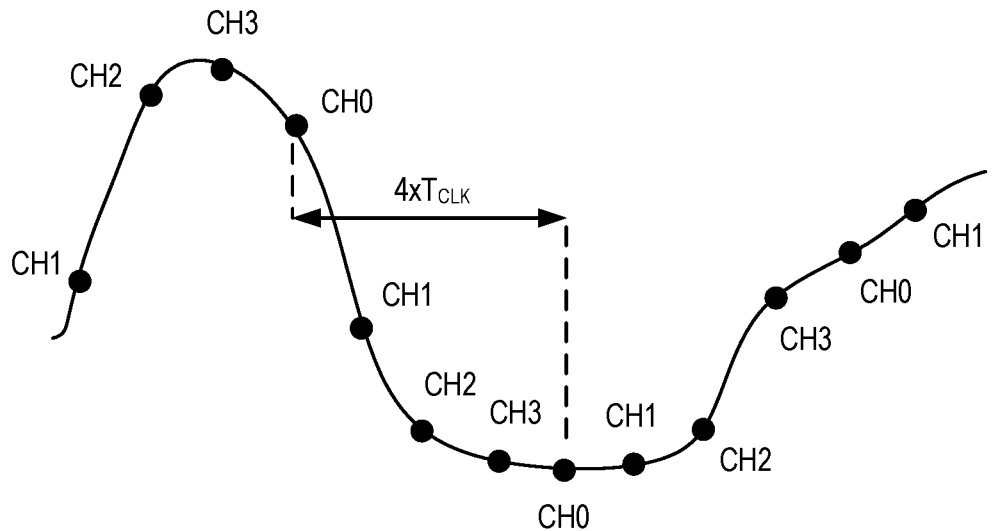
FIG. 5A illustrates an example sampled waveform.
Figure 5B:
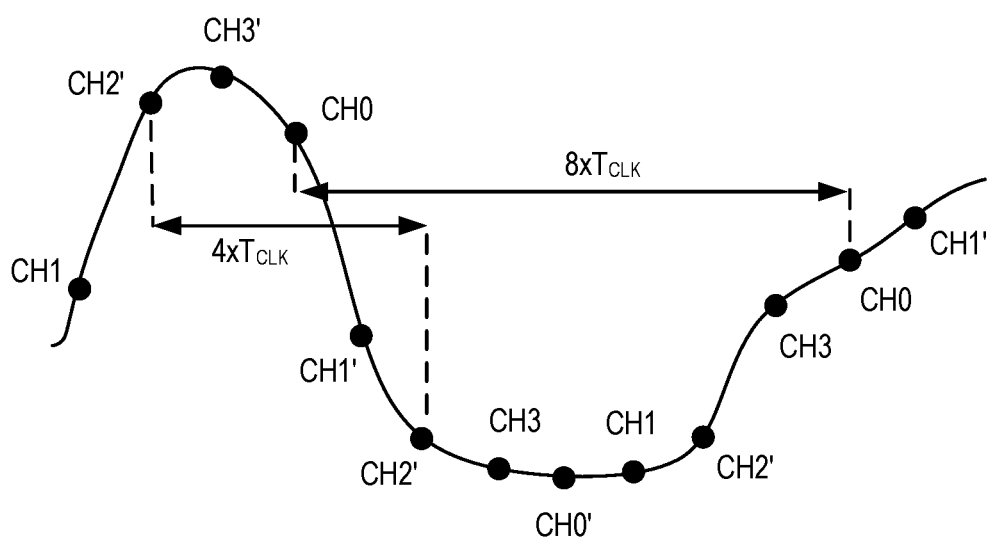
FIG. 5B illustrates an example sampled waveform with use of a chopping circuit.

The addition of the chopping circuit 206 has two important consequences for the time-skew calibration algorithm. Consider a case where N (number of channels) equals four. If the chopping circuit 206 is omitted, the sequence of sampling events is fixed. FIG. 5A illustrates an example sampled waveform. Each channel 202 samples the input signal in turn, as illustrated by the markers on the waveform. As shown in FIG. 5A, channel 1 always follows channel 0; channel 2 always follows channel 1; and channel 3 always follows channel 2. Each sampling switch is used at a fixed interval of four times the clock period ($T_{CLK}$). Consider another case where N equals four and the chopping circuit 206 is present as shown in FIG. 3. FIG. 5B illustrates an example sampled waveform with use of the chopping circuit 206. Each channel 202 still samples the signal in turn, but for each channel there is now a pseudorandom selection between two different switches with slightly different sampling times. These are denoted as CHx and CHx' as shown in FIG. 5B. The addition of the chopping circuit 206 doubles the number of sampling times to be calibrated from four to eight in the example. Further, the sampling positions no longer occur at regular intervals. Depending on the PRBS circuit 312, CHx' might not be used for an extended amount of time, with CHx being used instead. This can introduce interaction between the input signal and the chopping sequence, adding significant noise to the calibration algorithm.

Figure 4A:
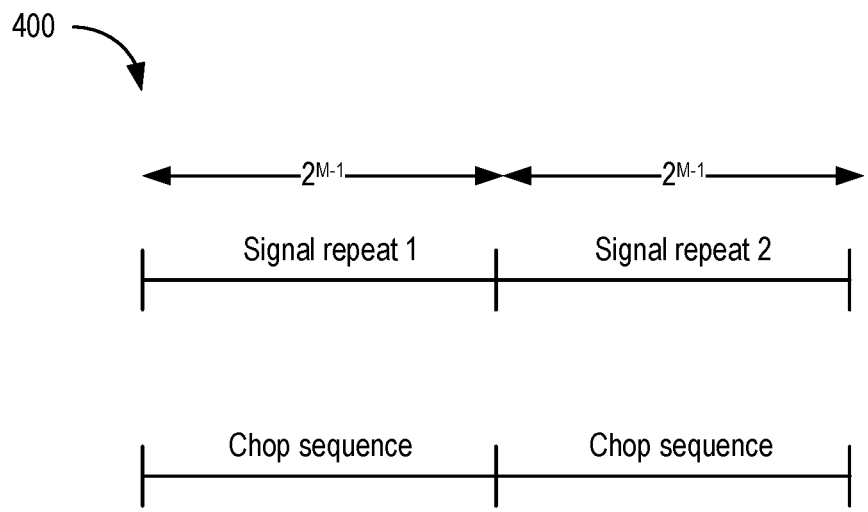
FIGS. 4A-B are timing diagrams illustrating the signal with respect to a pseudrandom sequence applied to chopping switches.
Figure 6:
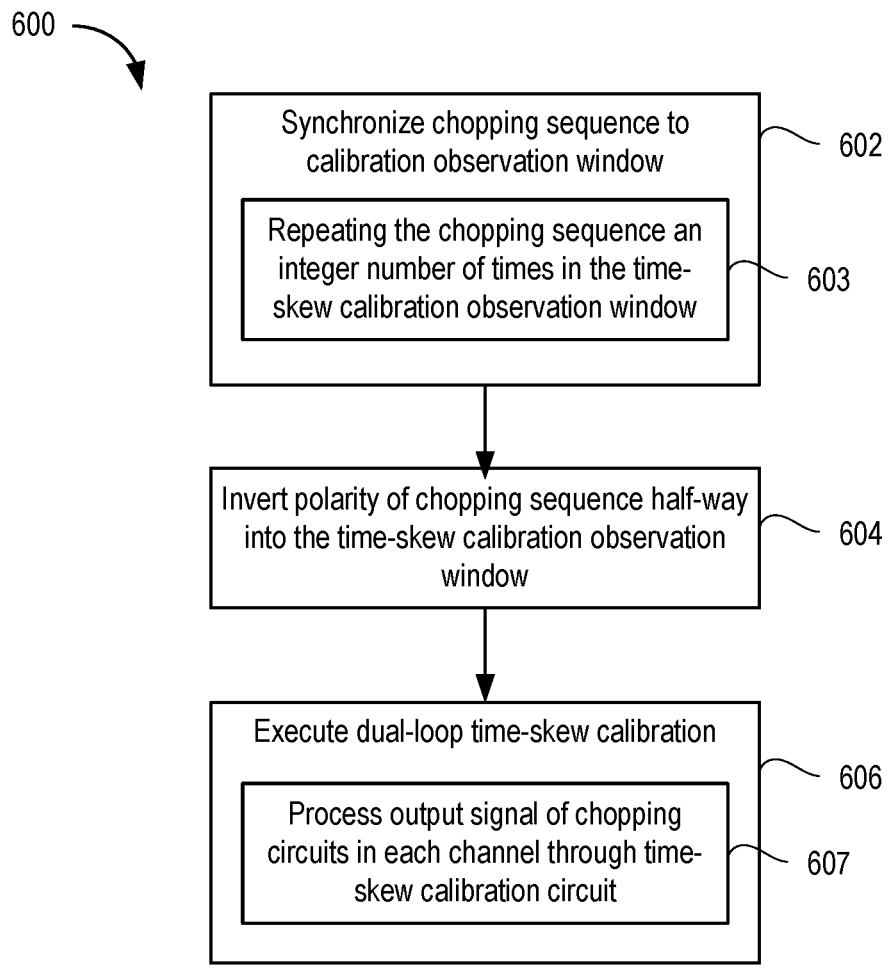
FIG. 6 is a flow diagram depicting a method of background calibration of a time-interleaved ADC with chopping sampling according to an example.

FIG. 6 is a flow diagram depicting a method 600 of background calibration of a time-interleaved ADC with chopping sampling according to an example. The method 600 begins at step 602, where the chopping sequence is synchronized to the calibration observation window. Stated differently, if the TSC circuit 108 observes N samples before each update, the chopping sequence should repeat an integer number of times in this window (603). This ensures that each iteration of the time-skew calibration occurs with an identical chopping sequence. A rotation of the sequence (e.g., due to some calculation cycles in the calibration logic) is not an issue. Any chopping sequence bits lost at the start of the sequence will occur at the end of the window. For a TSC observation of $2^M$ cycles, this frequency lock can be achieved using an M-bit linear feedback shift register (LFSR) as the PRBS circuit 312 with a single zero inserted somewhere in the sequence. This additional zero increases the repetition period to $2^{M}-1$ cycles and balances the number of zeros and ones, ensuring that both chopping polarities are equally likely. The modified sequence repeats twice in each TSC observation of $2^M$ cycles. FIG. 4A is a timing diagram illustrating the relation between the chopping sequence and the input signal. The signal repeats after $2^{M-1}$ samples. The chop sequence repeats accordingly in synchronization with the input signal. The control circuit 208 can control the PRBS circuit 312 to achieve the above-described chopping sequence synchronization.

Figure 4B:
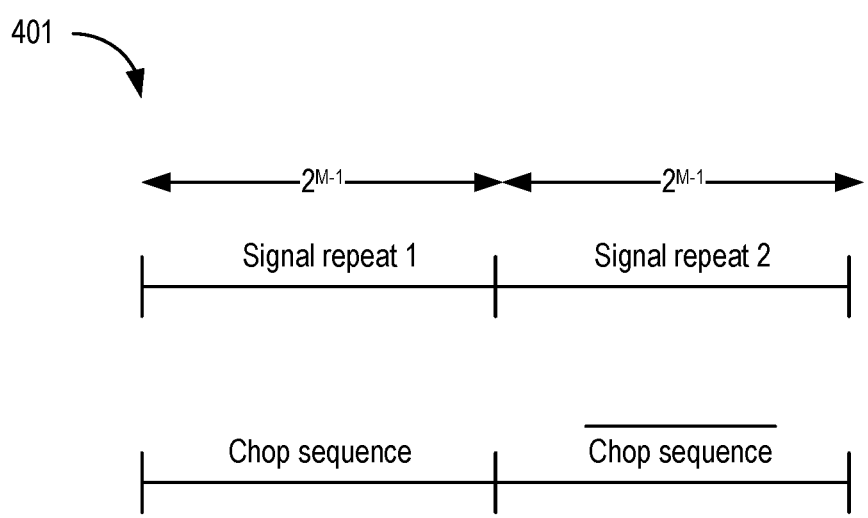

At step 604, the polarity of the chopping sequence is inverted half-way within the TSC observation window. Such inversion can be used when there is the possibility that the input signal is coherent with half of the TSC observation window. Due to the polarity swap and the signal repetition (step 602), inputs sampled by switch CHx during the first half of the window are also sampled by CHx' during the second half and vice versa. As a result, each sampling switch effectively samples one repetition of the signal at regular intervals, avoiding the problem of the non-uniform sampling points for this class of signal. FIG. 4B shows a timing diagram illustrating the chopping sequence inversion between the first repetition and the second repetition. The control circuit 208 can control the PRBS circuit 312 to achieve the above-described chopping sequence inversion.

At step 606, a dual-loop time-skew calibration process is executed by the TSC circuit 108 under control of the control circuit 208. For signals that are not coherent with half of the TSC observation window, the effect of non-uniform sampling of each set of switches can be minimized by implementing independent loops for the average and difference of each pair of CHx/CHx'. The TSC circuit 108 and the dual-loop time-skew calibration process are described further below. In an example, at step 607, the output signal of the chopping circuits in each channel is processed through the TSC circuit 108, as described further below with respect to FIGS. 7A and 7B.

Figure 7A:
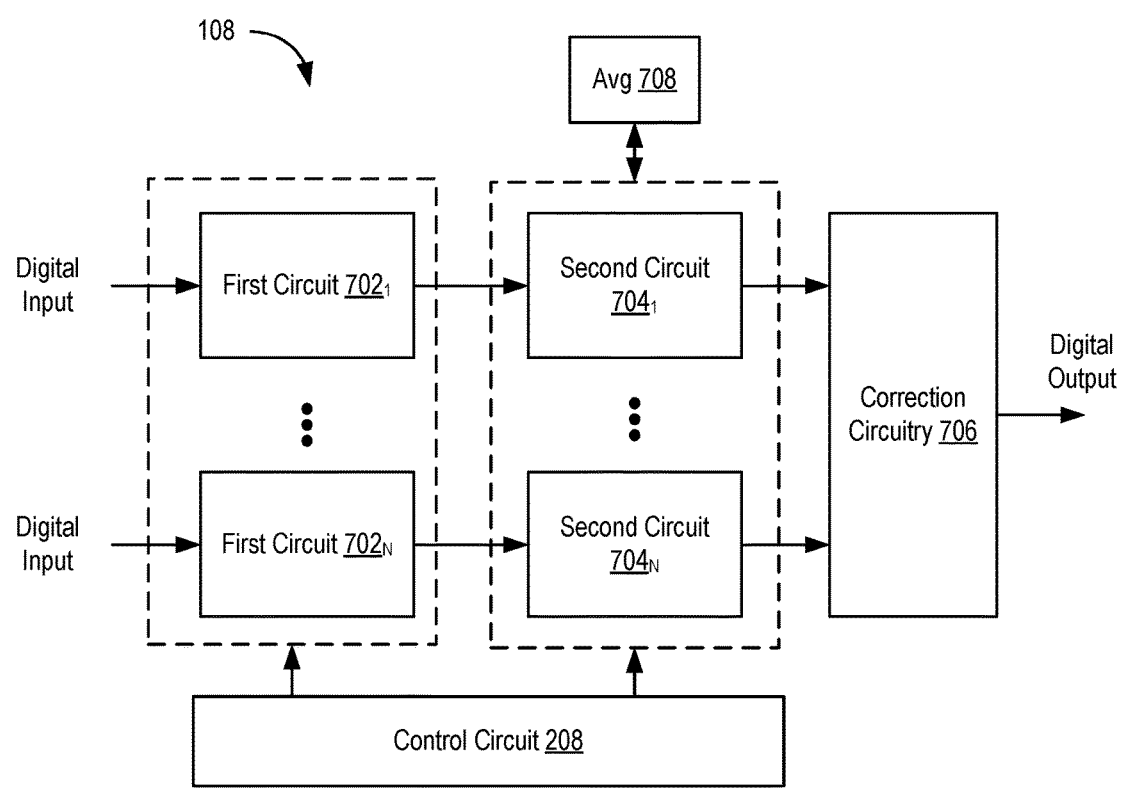
FIG. 7A is a block diagram depicting the TSC circuit according to an example.
Figure 7B:
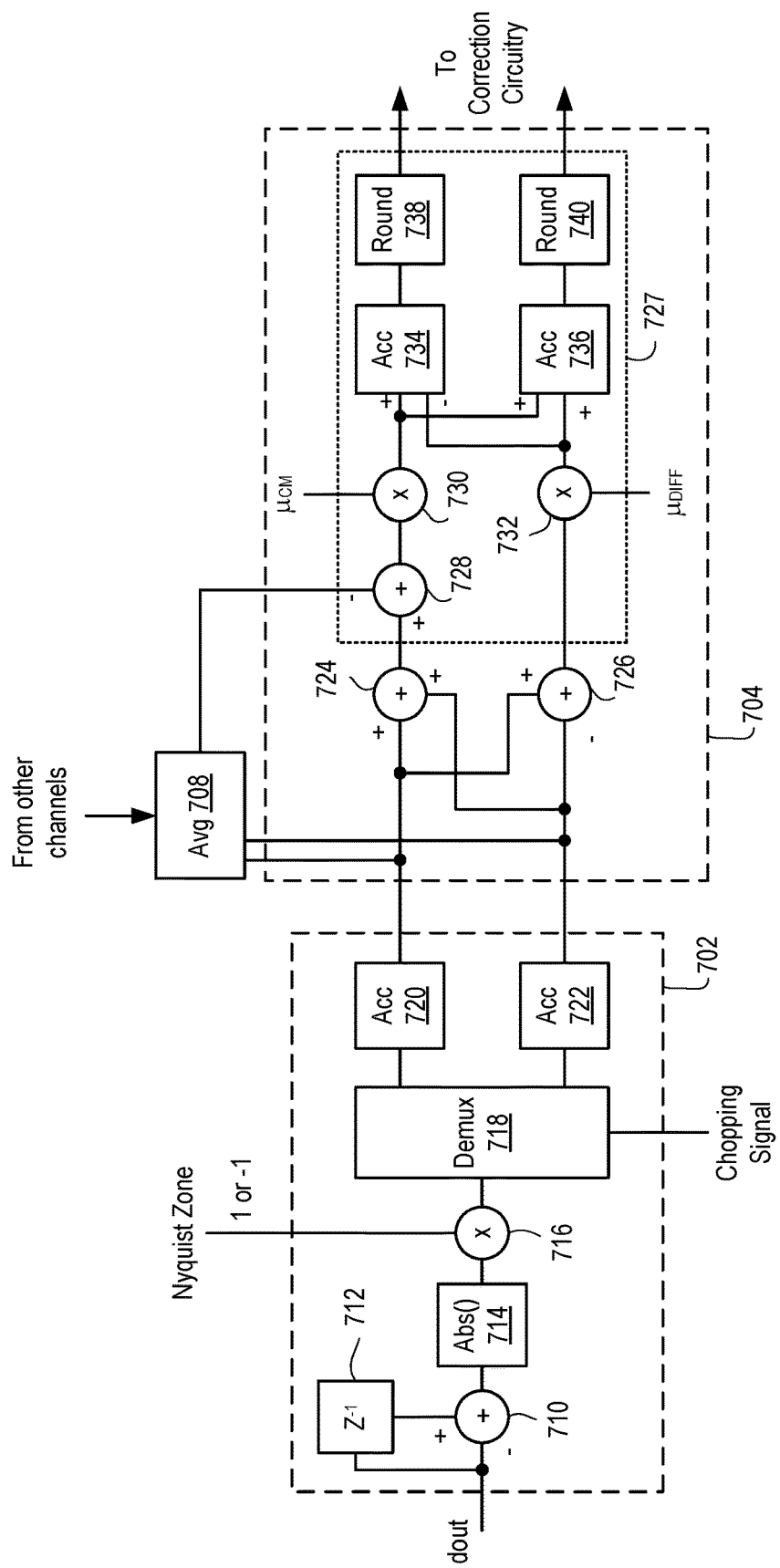
FIG. 7B is a block diagram depicting portions of the TSC circuit in more detail according to an example.

FIG. 7A is a block diagram depicting the TSC circuit 108 according to an example. FIG. 7B is a block diagram depicting portions of the TSC circuit 108 in more detail according to an example. The TSC circuit 108 includes a plurality of first circuits 702 (e.g., first circuits $702_1$ . . . $702_N$), a plurality of second circuits 704 (e.g., second circuits $704_1$ . . . 704N), and correction circuitry 706. The TSC circuit 108 includes a first circuit 702 and second circuit 704 for each channel of the time-interleaved ADC (e.g., N in the present example). Inputs of the first circuits $702_1$ . . . $702_N$ are coupled to outputs of the ADC channels 202. Outputs of the first circuits $702_1$ . . . $702_N$ are coupled to inputs of the second circuits $704_1$ . . . 704N. Outputs of the second circuits $704_1$ . . . 704N are coupled to inputs of the correction circuitry 706. The TSC circuit 108 further includes an average circuit 708 coupled to the second circuits $704_1$ . . . 704N. The control circuit 208 is coupled to control inputs of the first circuits 702 and the second circuits 704. In operation, the first circuits 702 process the digital input signals from the ADC channels 202 for $2^M$ cycles (the TSC observation window). After $2^M$ cycles, the first circuits 702 are reset. The second circuits 704 processes the outputs of the first circuits 702 after each $2^M$ cycle period.

As shown in FIG. 7B, a first circuit 702 includes an subtractor 710, a delay circuit 712, an absolute value circuit 714, a multiplier 716, a demultiplexer 718, an accumulator 720, and an accumulator 722. A corresponding second circuit 704 includes an adder 724, a subtractor 726, and a decision circuit 727. The decision circuit 727 includes a subtractor 728, a multiplier 730, a multiplier 732, an accumulator 734, an accumulator 736, a rounding circuit 738, and a rounding circuit 740.

In the first circuit 702, the subtractor 710 and the delay circuit 712 receives a signal dout from an ADC channel 202. The subtractor 710 is also coupled to an output of the delay circuit 712. An output of the subtractor 710 is coupled to an input of the absolute value circuit 714. An output of the absolute value circuit 714 is coupled to an input of the multiplier 716. Another input of the multiplier 716 receives a Nyquist zone signal. An output of the multiplier 716 is coupled to an input of the demultiplexer 718. Outputs of the demultiplexer 718 are coupled to the accumulators 720 and 722, respectively. A control input of the demultiplexer 718 is coupled to receive a chopping signal from the PRBS circuit 312.

In operation, the subtractor 710 subtracts the output of the delay circuit 712 from the signal dout. The absolute value circuit 714 takes the absolute value of the result output by the subtractor 710. The multiplier 716 multiplies the result of the absolute value operation by a 1 or −1 as determined by the Nyquist zone signal. The demultiplexer couples the output of the multiplier 716 to either the accumulator 720 or the accumulator 722 depending on the value of the chopping signal. This operation proceeds for $2^M$ cycles. For each ADC channel 202, a certain number of samples from CHx and CHx' are independently accumulated in the accumulator 720 and the accumulator 722, with a sign inversion depending on whether the input signal is in an odd or even Nyquist zone.

In the second circuit, inputs of the adder 724 are coupled to an output of the accumulator 720 and an output of the accumulator 722. Inputs of the subtractor 726 are coupled to an output of the accumulator 720 and an output of the accumulator 722. An output of the adder 724 is coupled to an input of the subtractor 728. An output of the subtractor 726 is coupled to an input of the multiplier 732. Outputs of the accumulators 720 and 722 in the first circuit 702 for each of the ADC channels 202 are coupled to inputs of the average circuit 708. An output of the average circuit 708 is coupled to another input of the subtractor 728 in each instance of the second circuit 704. An output of the subtractor 728 is coupled to an input of the multiplier 730. Another input of the multiplier 730 is configured to receive a signal $\mu_{Cm}$. Another input of the multiplier 732 is configured to receive a signal $\mu_{DIFF}$. An output of the multiplier 730 is coupled to inputs of the accumulator 734 and the accumulator 736. An output of the multiplier 732 is coupled to inputs of the accumulator 734 and the accumulator 736. An output of the accumulator 734 is coupled to the rounding circuit 738. An output of the accumulator 736 is coupled to the rounding circuit 740. Outputs of the rounding circuits 738 and 740 are coupled to the correction circuitry 706.

In operation, after $2^M$ cycles have been accumulated in the accumulators 720 and 722, the sum and difference of the two accumulators 720 and 722 are calculated by the adder 724 and the subtractor 726, respectively. In addition, the average accumulator output across all channels is calculated by the average circuit 708. The difference between the sum (as output by the adder 724) and the average (as output by the average circuit 708) is multiplied by the value $\mu_{CM}$ and added to each accumulator 734 and 736. The difference between both accumulators 720 and 722 is multiplied by $\mu_{DIFF}$ and added to the accumulator 734 and subtracted from the accumulator 736. It can be seen that this arrangement implements a common-mode loop that affects the accumulator 734 and the accumulator 736 identically, as well as a differential loop that affects the difference between the accumulators 734 and 736. The common-mode loop takes data from both CHx and CHx', and is thus not affected by sampling point uncertainty. This loop is identical to the loop used to calibrate the ADC without the chopping switch. The differential loop, on the other hand, is affected by sampling point uncertainty: random interaction between the ADC input signal and chopping signal can introduce a large amount of noise in the extraction of the time-skew. This noise can be suppressed by choosing a very small value for $\mu_{DIFF}$ at the cost of a slower loop, which takes longer to settle initially and is less able to respond to environmental changes. The advantage of the arrangement described above is that only the difference between the accumulators 734 and 736 needs to be slowed down for noise suppression, while the common-mode loop can be fast.

Figure 8:
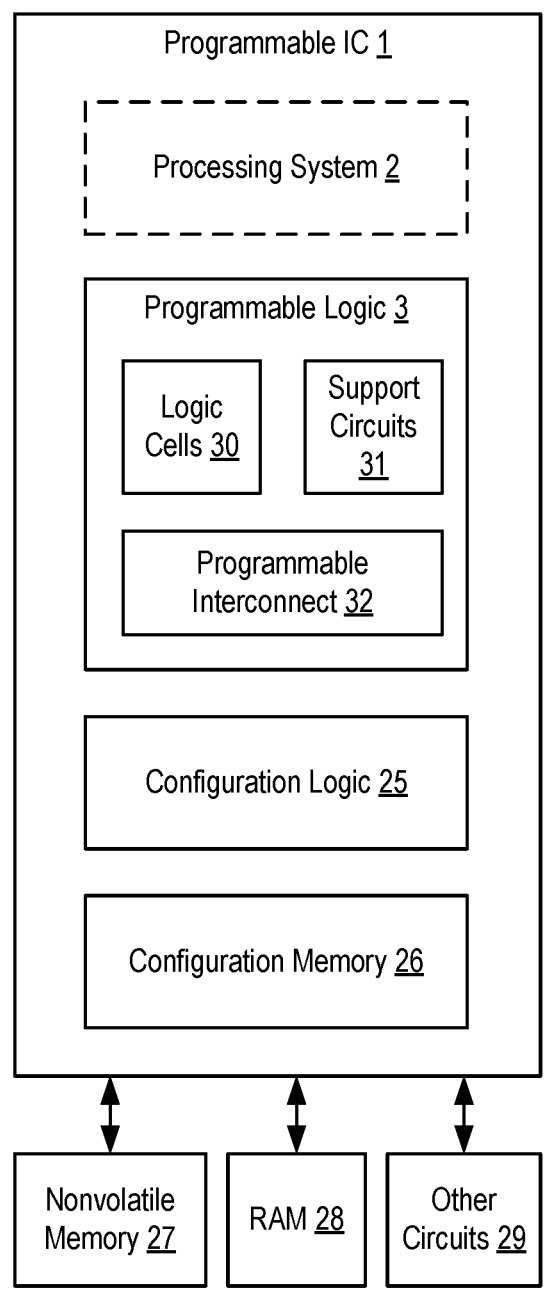
FIG. 8 is a block diagram depicting a programmable integrated circuit (IC) in which techniques described herein can be employed.

FIG. 8 is a block diagram depicting a programmable IC 1 according to an example in which the inline ADC circuitry 104 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 9:
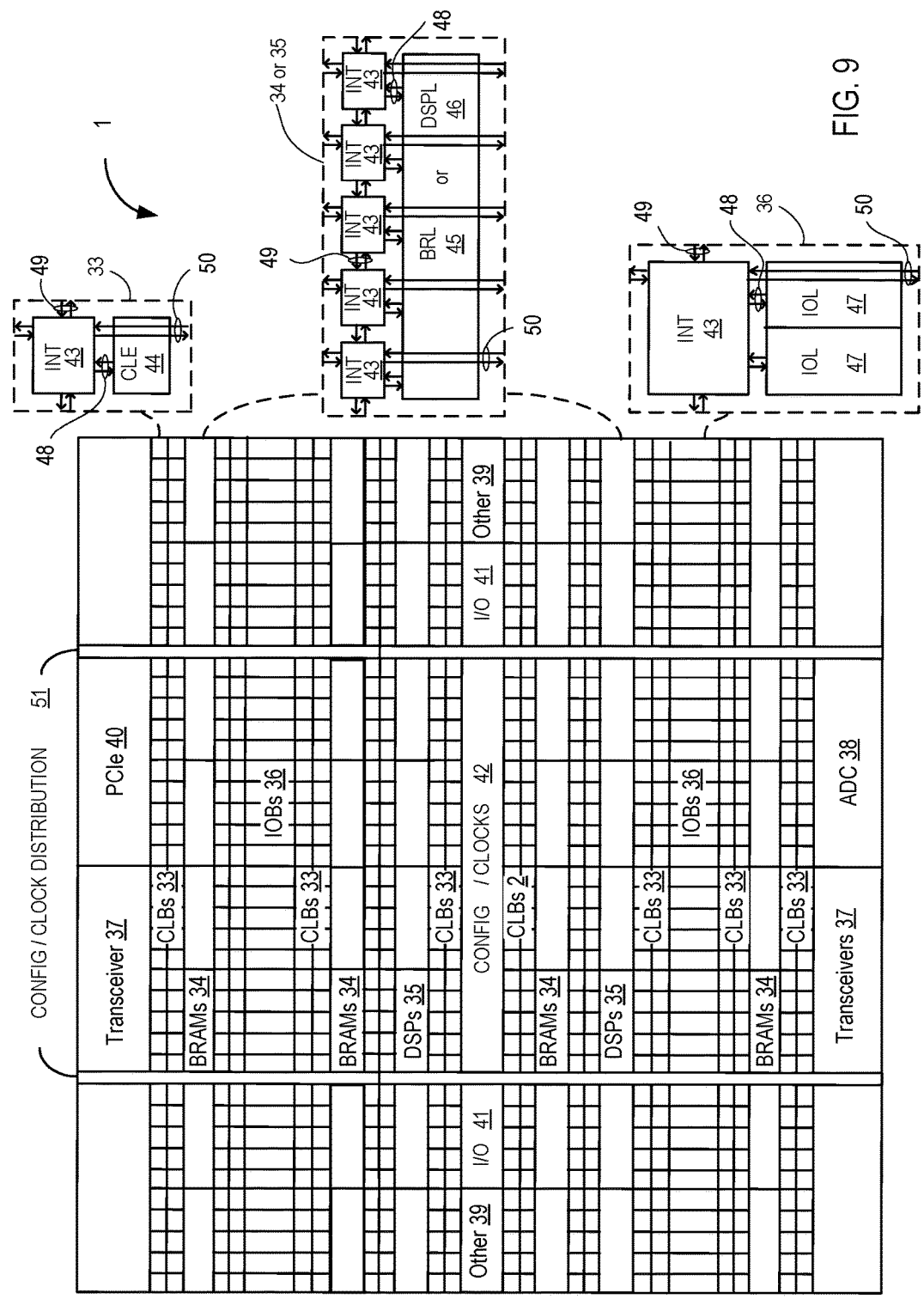
FIG. 9 is a schematic diagram of a field programmable gate array (FPGA) architecture in which techniques described herein can be employed.

FIG. 9 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like, including the ADC circuitry 104.

In some FPGAs, each programmable tile can include at least one programmable interconnect element ("INT") 43 having connections to input and output terminals 48 of a programmable logic element within the same tile, as shown by examples included at the top of FIG. 9. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 9) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A time-skew calibration circuit, comprising:
a plurality of first circuits, each including a first accumulator and a second accumulator;
a plurality of second circuits, each including:
a first adder coupled to outputs of the first accumulator and the second accumulator;
a first subtractor coupled to the outputs of the first accumulator and the second accumulator; and
a decision circuit configured to combine an output of the first adder and an output of the first subtractor, the decision circuit comprising a second subtractor coupled to an output of the first adder, a first multiplier coupled to an output of the second subtractor, and a second multiplier coupled to an output of the first subtractor.

2. The time-skew calibration circuit of claim 1, wherein the decision circuit further comprises:
a third accumulator coupled to outputs of the first and second multipliers; and
a fourth accumulator coupled to the outputs of the first and second multipliers.

3. The time-skew calibration circuit of claim 1, wherein each of the plurality of first circuits further includes:
a third subtractor;
an absolute value circuit coupled to an output of the third subtractor;
a third multiplier coupled to an output of the absolute value circuit; and
a demultiplexer having an input coupled to an output of the third multiplier and outputs coupled to inputs of the first and second accumulators.

4. The time-skew calibration circuit of claim 1, further comprising:
an average circuit coupled to the outputs of the first and second accumulators and to an input of the second subtractor.

5. The time-skew calibration circuit of claim 2, wherein each of the plurality of second circuits comprises:
first and second rounding circuits respectively coupled to outputs of the third and fourth accumulators.

6. The time-skew calibration circuit of claim 1, further comprising:
a plurality of correction circuits respectively coupled to outputs of the plurality of second circuits.

7. An analog-to-digital converter (ADC), comprising:
a plurality of channels each including a chopping circuit; and
a time-skew calibration circuit coupled to the plurality of channels, comprising:
a plurality of first circuits, each including a first accumulator and a second accumulator;
a plurality of second circuits, each including:
a first adder coupled to outputs of the first accumulator and the second accumulator;
a first subtractor coupled to the outputs of the first accumulator and the second accumulator; and
a decision circuit configured to combine an output of the first adder and an output of the first subtractor, the decision circuit comprising a second subtractor coupled to an output of the first adder, a first multiplier coupled to an output of the second subtractor, and a second multiplier coupled to an output of the first subtractor.

8. The ADC of claim 7, wherein the decision circuit further comprises:
a third accumulator coupled to outputs of the first and second multipliers; and
a fourth accumulator coupled to the outputs of the first and second multipliers.

9. The ADC of claim 7, wherein each of the plurality of first circuits further includes:
a third subtractor;
an absolute value circuit coupled to an output of the third subtractor;
a third multiplier coupled to an output of the absolute value circuit; and
a demultiplexer having an input coupled to an output of the third multiplier and outputs coupled to inputs of the first and second accumulators.

10. The ADC of claim 7, further comprising:
an average circuit coupled to the outputs of the first and second accumulators and to an input of the second subtractor.

11. The ADC of claim 8, wherein each of the plurality of second circuits comprises:
   first and second rounding circuits respectively coupled to outputs of the third and fourth accumulators.

12. The ADC of claim 7, further comprising:
   a plurality of correction circuits respectively coupled to outputs of the plurality of second circuits.

13. A method of time-skew calibration for a time-interleaved analog-to-digital converter (ADC), comprising:
   synchronizing a chopping sequence applied to chopping circuits in channels of the ADC to a time-skew calibration observation window;
   inverting polarity of the chopping sequence half-way into the time-skew calibration observation window; and
   executing a dual-loop time-skew calibration on outputs of the channels of the ADC by processing an output signal of the chopping circuits in each of the channels through a plurality of first circuits and a plurality of second circuits, each of the plurality of first circuits including a first accumulator and a second accumulator, each of the plurality of second circuits including: a first adder coupled to outputs of the first accumulator and the second accumulator; a first subtractor coupled to the outputs of the first accumulator and the second accumulator; and a decision circuit configured to combine an output of the first adder and an output of the first subtractor, the decision circuit comprising a second subtractor coupled to an output of the first adder, a first multiplier coupled to an output of the second subtractor, and a second multiplier coupled to an output of the first subtractor.

14. The method of claim 13, wherein the step of synchronizing the chopping sequence comprises:
   repeating the chopping sequence an integer number of times in the time-skew calibration observation window.

15. The method of claim 13, wherein the decision circuit further comprises a third accumulator coupled to outputs of the first and second multipliers, and a fourth accumulator coupled to the outputs of the first and second multipliers.

16. The method of claim 13, wherein each of the plurality of first circuits further includes a third subtractor, an absolute value circuit coupled to an output of the third subtractor, a third multiplier coupled to an output of the absolute value circuit; and a demultiplexer having an input coupled to an output of the third multiplier and outputs coupled to inputs of the first and second accumulators.

* * * * *